(12) United States Patent
Adachi et al.

(10) Patent No.: US 7,585,745 B2
(45) Date of Patent: Sep. 8, 2009

(54) SEMICONDUCTOR DEVICE AND A METHOD OF MANUFACTURING THE SAME

(75) Inventors: Tetsuo Adachi, Hitachinaka (JP); Akihiko Sato, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 466 days.

(21) Appl. No.: 11/297,488

(22) Filed: Dec. 9, 2005

(65) Prior Publication Data

US 2006/0128110 A1 Jun. 15, 2006

(30) Foreign Application Priority Data

Dec. 10, 2004 (JP) ............................. 2004-357489

(51) Int. Cl.
*H01L 21/76* (2006.01)
(52) U.S. Cl. ................. 438/424; 438/400; 257/E21.545
(58) Field of Classification Search ................. 438/424, 438/400; 257/E21.545
See application file for complete search history.

(56) References Cited

FOREIGN PATENT DOCUMENTS

JP 2001-15586 1/2001

*Primary Examiner*—Bradley K Smith
(74) *Attorney, Agent, or Firm*—Antonelli, Terry, Stout & Kraus, LLP.

(57) ABSTRACT

A technique is provided which permits formation within a single chip both a field effect transistor of high reliability capable of suppressing the occurrence of a crystal defect and a field effect transistor of a high integration degree. In a mask ROM section having an element isolation region with an isolation width of smaller than 0.3 µm, a planar shape of each active region ACT is made polygonal by cutting off the corners of a quadrangle, thereby suppressing the occurrence of a crystal defect in the active region ACT and diminishing a leakage current flowing between the source and drain of a field effect transistor. In a sense amplifier data latch section which is required to have a layout of a small margin in the alignment between a gate G of a field effect transistor and the active region ACT, the field effect transistor is disposed at a narrow pitch by making the active region ACT quadrangular.

12 Claims, 15 Drawing Sheets

FIG. 3(a)
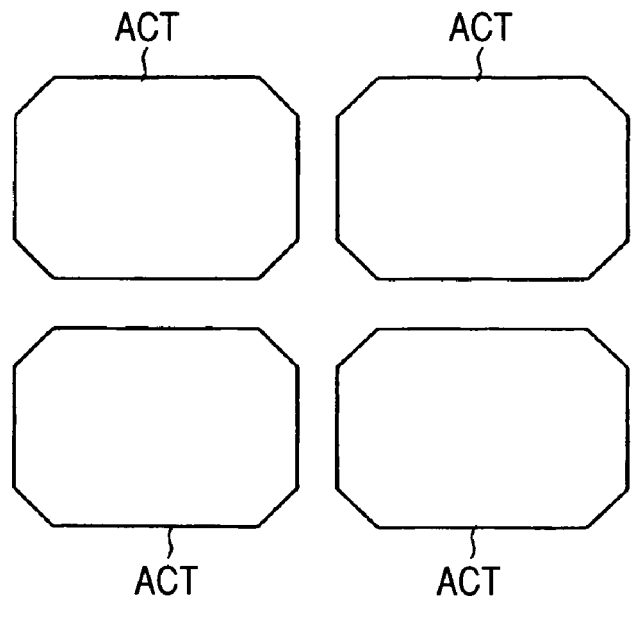
FIG. 3(b)
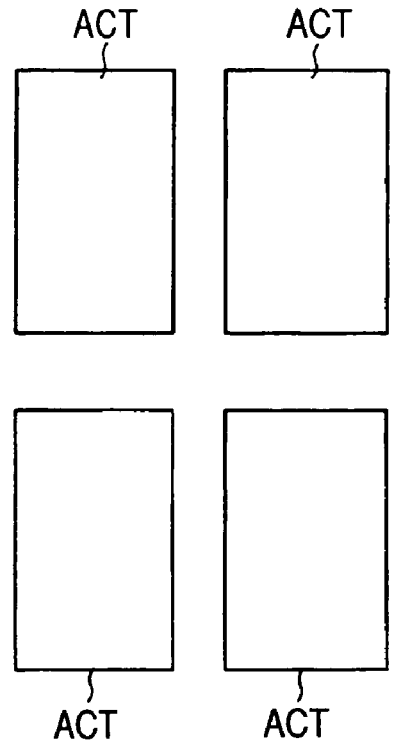
FIG. 3(c)
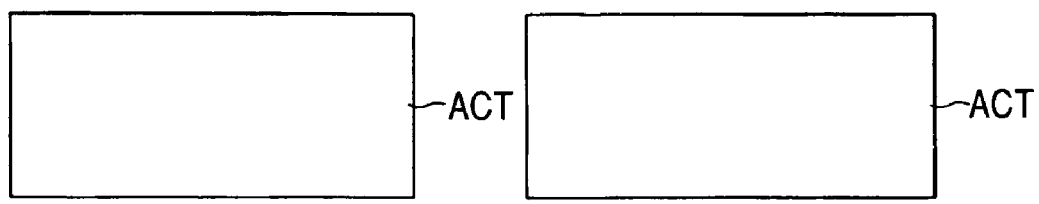
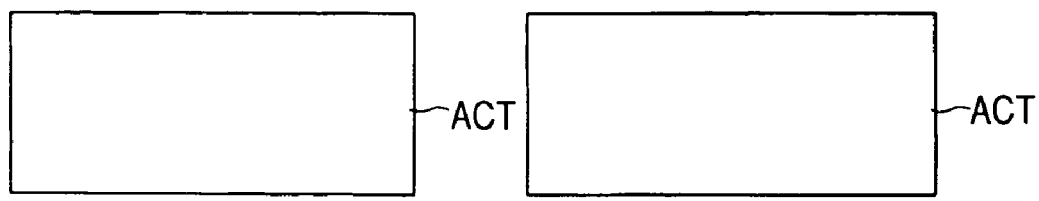

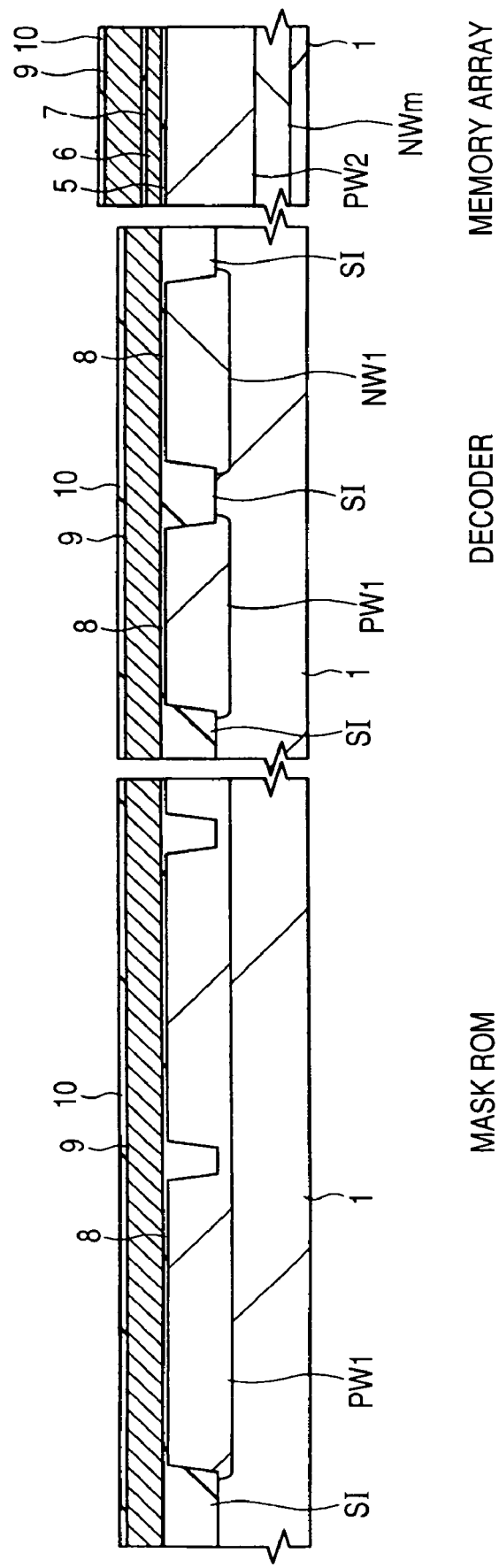

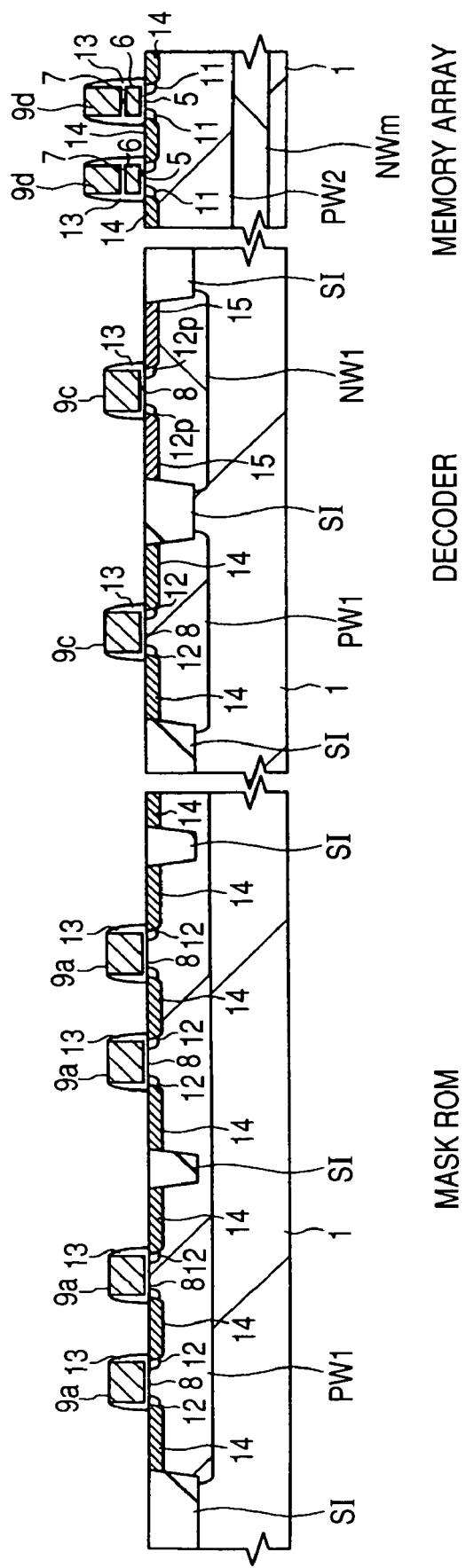

SEMICONDUCTOR DEVICE AND A METHOD OF MANUFACTURING THE SAME

CROSS-REFERENCE TO RELATED APPLICATION

The present application claims priority from Japanese patent application No. 2004-357489 filed on Dec. 10, 2004, the content of which is hereby incorporated by reference into this application.

BACKGROUND OF THE INVENTION

The present invention relates to a semiconductor device and a manufacturing technique for the same. Particularly, the present invention is concerned with a technique effective in its application to the manufacture of plural semiconductor elements which are electrically isolated from one another by element isolation having a width of 0.3 µm or less for example.

As one of element isolation methods for isolating adjacent semiconductor elements electrically from each other there is known a shallow trench isolation (hereinafter referred to as "STI"). According to the structure of STI, a trench having a depth of about 0.4 µm for example is formed in an element isolation region of a substrate and an insulating film is embedded therein.

For example, in Japanese Unexamined Patent Publication No. 2001-15586 (Patent Literature 1) there is disclosed a semiconductor device having a trench structure region and an element region both formed adjacent to each other on a semiconductor substrate having {100} plane as a semiconductor substrate surface, at least a part of the boundary between the trench structure region and the element region as seen in a direction <100> perpendicular to the substrate being formed in the direction of <010> axis or the vicinity thereof.

[Patent Literature 1]
Japanese Unexamined Patent Publication No. 2001-15586

SUMMARY OF THE INVENTION

In a flash memory which is a kind of a nonvolatile memory capable of electrically writing and erasing of data, there are various technical problems as described hereinafter.

The present inventors have been making a product development of a 4 Gbit flash memory with a mask ROM (Read Only Memory) mounted on one and same semiconductor chip. In this product development, a further microfabrication of a semiconductor element is requested and various studies have been made in an effort to meet this request. However, there still remain some problems to be solved. For example, in the case of a 1 Gbit flash memory, the minimum width of element isolation in a mask ROM is about 0.3 µm, while that in a 4 Gbit flash memory is smaller than 0.3 µm. However, it has become clear that if the width of element isolation is set at a value of smaller than 0.3 µm, there flows a leakage current between the source and drain of field effect transistors which constitute the mask ROM, giving rise to a problem such as an increase of power consumption or the destruction of ROM data.

Plural field effect transistors which constitute the mask ROM are arranged in a sandwiching relation to an element isolation having a width of 0.3 µm or less, which element isolation is constituted by STI. After the formation of STI, an oxidizing treatment or heat treatment is applied to the substrate. At this time, the volume of the insulating film embedded in the interior of the trench of STI expands or contracts, whereby a stress is induced in an active region enclosed by STI. It is presumed that this stress causes dislocation or crystal defect in the active region and the aforesaid leakage current flows.

In order to prevent the occurrence of such dislocation or crystal defect in the active region, the present inventors have studied a technique wherein a planar shape of the active region is made polygonal (e.g., octagonal or dodecagonal) by cutting off the four corners of a quadrangle to diminish the stress imposed on the corners of the active region.

However, the following point has become clear in the case of a polygonal planar shape of the active region. In order to prevent the occurrence of misalignment between the gate electrode of a field effect transistor and the active region or between a contact hole which reaches the source and drain of the field effect transistor and the active region, it is necessary that the alignment margin be taken large in comparison with the case where the planar shape of the active region is not made polygonal, with consequent increase of the device size.

For example, when there occurs misalignment between gate electrodes and the active region, the channel width of the field effect transistor varies and the device characteristics are deteriorated (e.g., a decrease of the channel current). Therefore, in the case where the planar shape of the active region is made polygonal, it is required that the layout of gate electrodes be made taking the portions cut off from the quadrangular shape of the active region into account. Further, for example when there occurs misalignment between contact holes and the active region, the contact holes are formed in a partially deviated state from the source and drain region having a predetermined impurity concentration, so that there occurs unnecessary junction leakage to the substrate through the contact holes, thus causing malfunction of the circuit.

It is an object of the present invention to provide a technique which permits formation within a single semiconductor chip both a field effect transistor of high reliability capable of suppressing the occurrence of a crystal defect and a field effect transistor of a high integration degree.

The above and other objects and novel features of the present invention will become apparent from the following description and the accompanying drawings.

The following is a brief description of typical modes of the present invention disclosed herein.

A semiconductor device according to the present invention comprises a plurality of first field effect transistors formed respectively in a plurality of first active regions enclosed by STI and a plurality of second field effect transistors formed respectively in a plurality of second active regions enclosed by STI, the first active regions each having a polygonal planar shape obtained by cutting off the corners of a quadrangle and the second active regions each having a quadrangular planar shape, the first and second active regions being formed within a single semiconductor chip.

A method of manufacturing a semiconductor device according to the present invention comprises the steps of forming a first active region enclosed by STI in a first region on a main surface of a semiconductor substrate and forming a second active region enclosed by STI on the substrate main surface; forming an insulating film on the surface of each of the first and second active regions on the semiconductor substrate; and forming a gate electrode of a first field effect transistor in the first region and forming a gate electrode of a second field effect transistor in the second region, wherein a planar shape of the first active region is made polygonal by cutting off the corners of a quadrangle, a planar shape of the second active region is made quadrangular, and the first and second active regions are formed within a single semiconductor chip.

The following is a brief description of effects obtained by the typical modes of the present invention disclosed herein.

By making the planar shape of the first active region polygonal by cutting off the corners of a quadrangle, the occurrence of crystal defect in the first active region is suppressed and it is possible to suppress the leakage current flowing for example between the source and drain of the first field effect transistor. Moreover, by making the planar shape of the second active region quadrangular, the second field effect transistor can be disposed at a relatively narrow pitch. As result, both first field effect transistor of high reliability and field effect transistor of a high integration degree can be formed within a single semiconductor chip.

BRIEF DESCRIPTION OF THE DRAWINGS

FIGS. 2(a), 2(b) and 2(c) are plane layout diagrams of a typical MIS formed within the semiconductor chip according to the first embodiment, in which FIG. 2(a) shows a mask ROM section, FIG. 2(b) shows a sense amplifier data latch section, and FIG. 2(c) shows a decoder section;

FIGS. 3(a), 3(b) and 3(c) are plan views of principal sections in a manufacturing step for a NOR type flash memory according to the first embodiment, in which FIG. 3(a) shows a mask ROM section, FIG. 3(b) shows a sense amplifier data latch section, and FIG. 3(c) shows a decoder section;

FIG. 7 is a sectional view of the same principal sections as FIG. 4 in a flash memory manufacturing step which follows FIG. 6;

FIG. 10 is a sectional view of the same principal sections as FIG. 4 in a flash memory manufacturing step which follows FIGS. 8 and 9;

FIGS. 15(a), 15(b) and 15(c) are plane layout diagrams of a typical MIS formed within a semiconductor chip according to a second embodiment of the present invention, in which FIG. 15(a) shows a mask ROM section, FIG. 15(b) shows a sense amplifier data latch section, and FIG. 15(c) shows a decoder section.

DETAILED DESCRIPTION OF PREFERRED EMBODIMENTS

Figure 1:
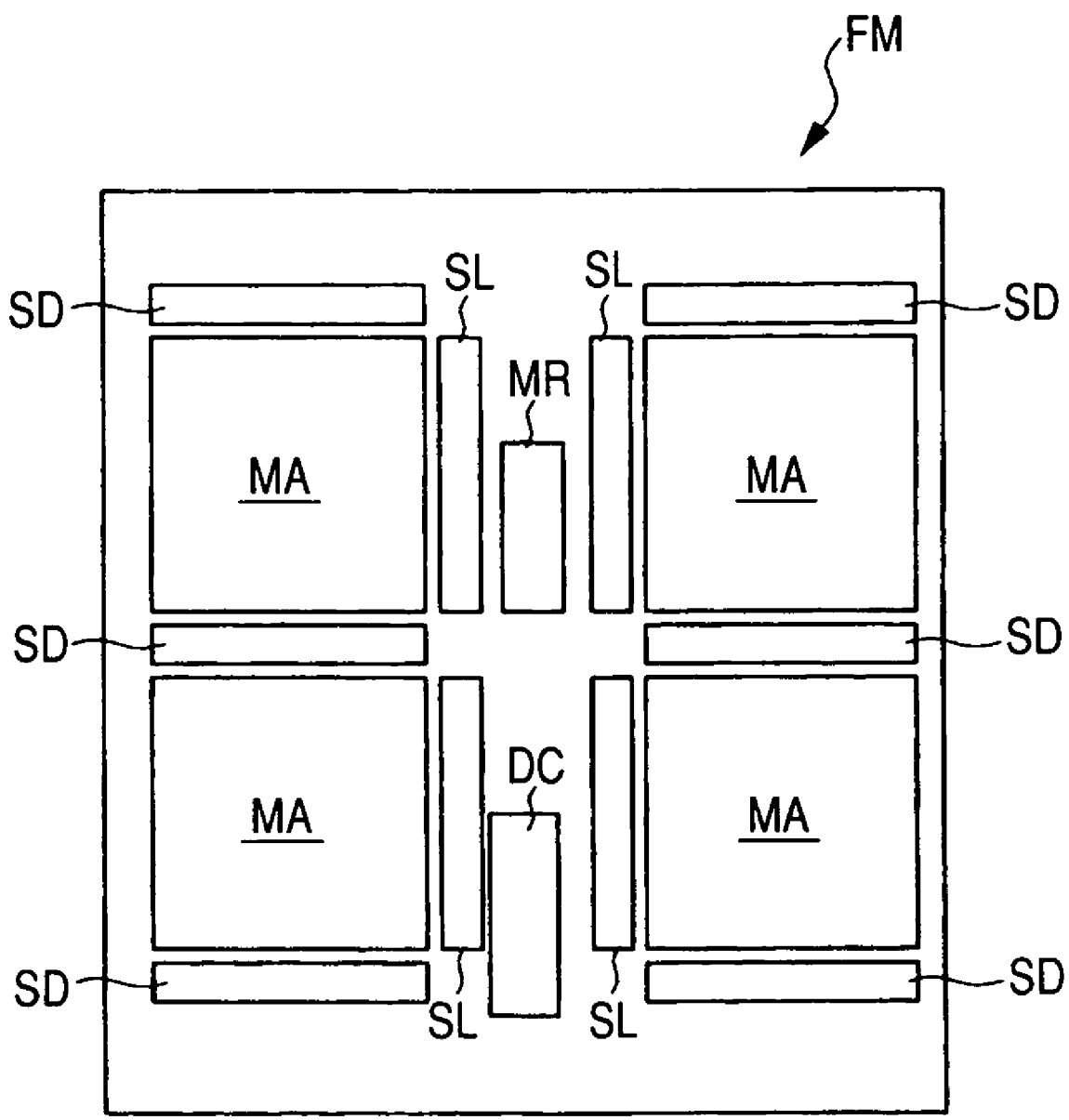
FIG. 1 is a chip configuration diagram showing main circuit blocks in the interior of a semiconductor chip of a semiconductor device with flash memory mounted thereon according to a first embodiment of the present invention.

A method of manufacturing an insulated gate type field effect transistor according to an embodiment of the present invention will be described below step by step with reference to FIGS. 1 to 10.

Where required for convenience' sake, embodiments of the present invention which follow will each be described in a divided manner into plural sections or embodiments, but unless otherwise mentioned, they are not unrelated to each other, but are in a relation such that one is a modification, a detailed description, or a supplementary explanation, of part or the whole of the other.

In the following embodiments, when reference is made to the number of elements (including the number, numerical value, quantity, and range), no limitation is made to the number referred to, but numerals above and below the number referred to will do as well unless otherwise mentioned and except the case where it is basically evident that limitation is made to the number referred to. Further, it goes without saying that in the following embodiments their constituent elements (including constituent steps) are not always essential unless otherwise mentioned and except the case where they are considered essential basically obviously. Likewise, it is to be understood that when reference is made to the shapes and positional relation of constituent elements in the following embodiments, those substantially closely similar to or resembling such shapes, etc. are also included unless otherwise mentioned and except the case where a negative answer results basically obviously. This is also true of the foregoing numerical value and range.

In the drawings related to the following embodiments, even a plan view may be hatched to make it easier to see. In the following embodiments, MIS·FET (Metal Insulator Semiconductor Field Effect Transistor), which is typical of the field effect transistor, is abbreviated to MIS, a p-channel MIS·FET is abbreviated to pMIS, and an n-channel MIS·FET is abbreviated to nMIS.

Further, in all of the drawings for illustrating the following embodiments, portions having the same functions are identified by like reference numerals, and repeated explanations thereof will be omitted. Embodiments of the present invention will be described in detail hereinunder with reference to the accompanying drawings.

First Embodiment

In this first embodiment, a description will be given below about the case where the present invention is applied to a flash memory having a memory capacity of 4 Gbit for example, provided the present invention is not limited to the 4 Gbit flash memory, but is also applicable to flash memories smaller or larger than 4 Gbit in memory capacity.

FIG. 1 is a chip configuration diagram showing main circuit blocks in the interior of a semiconductor chip of a semiconductor device with a flash memory mounted thereon according to the first embodiment of the present invention.

The semiconductor device, denoted by FM, comprises a memory array MA which occupies the greater part of a main surface of a semiconductor substrate, a decoder section SD for selecting a memory cell, a sense amplifier data latch section SL for amplifying a weak signal and storing data, and a logic section for controlling these circuits, with a mask ROM section MR and power-supply DC further included therein. The memory array MA includes a predetermined number of word lines arranged at a predetermined pitch, a predetermined number of bit lines arranged at a predetermined pitch in a direction perpendicular to the word lines, and a large number of memory cells arranged latticewise respectively at substantial intersecting points between the word lines and the bit lines.

Figure 2A:
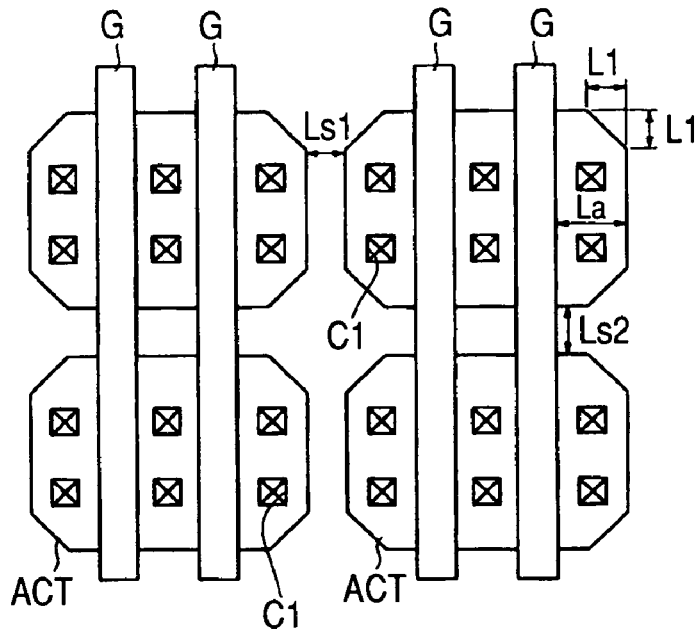
Figure 2B:
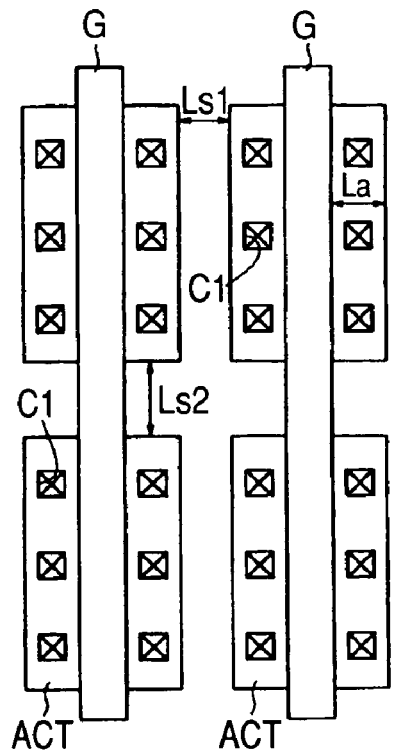
Figure 2C:
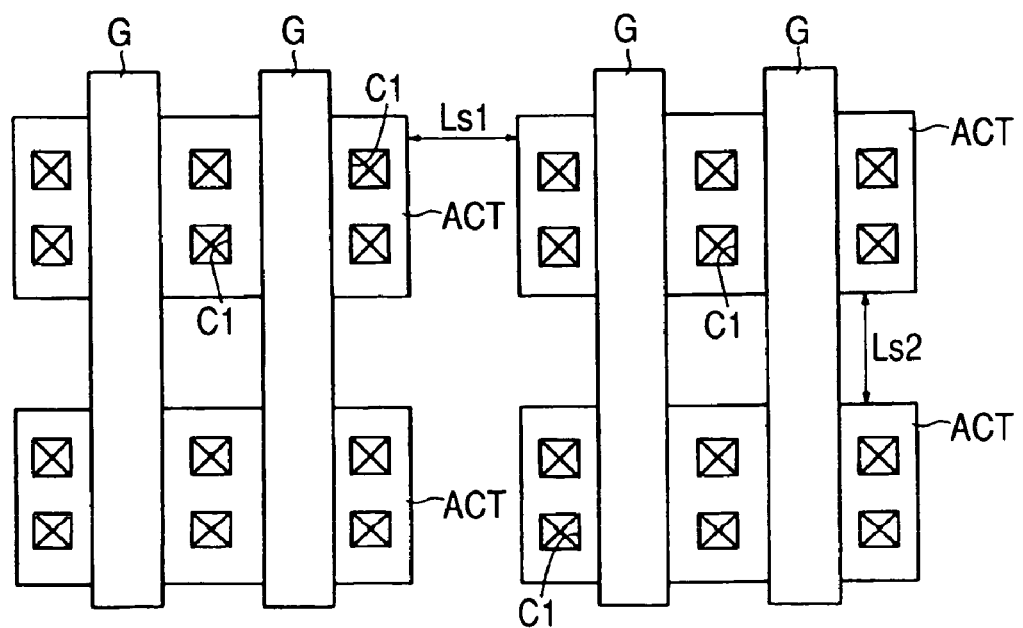

FIGS. 2(a), 2(b) and 2(c) are plane layout diagrams of a typical MIS formed within a semiconductor chip according to this first embodiment, in which FIG. 2(a) shows a mask ROM section, FIG. 2(b) shows a sense amplifier data latch section, and FIG. 2(c) shows a MIS which constitutes a decoder section.

The mask ROM section includes plural active regions ACT formed on the main surface of the semiconductor substrate and an element isolation region which surrounds each active region ACT and which electrically isolates adjacent active regions ACT.

In each active region ACT is formed a MIS having, for example, gates G and a source and a drain. For example, the active region ACT is formed so as to have a dimension of about 4 μm in a direction parallel to the gate length of MIS and a dimension of about 2 μm in a direction perpendicular to the gate length.

The element isolation region is constituted by STI for example and an isolation width (Ls1) thereof in a direction parallel to the gate length of MIS is, for example, about 0.2 μm, while an isolation width (Ls2) thereof in a direction perpendicular to the gate length is, for example, 0.25 μm. These dimensions of the active region ACT and the element isolation region are determined taking into account such channel length and width of MIS for obtaining desired operation characteristics, as well as alignment of the gates G with the active region ACT and alignment between the gates G and contact holes C1.

If the gate length of MIS is 0.5 μm and if the above dimensions are used, the distance (La) between the active region ACT—element isolation region boundary and a side face of the gate G is, for example, about 1 μm and thus there occurs a margin in the alignment between the gate G and the active region ACT. In the mask ROM section, therefore, even if a planar shape of the active region ACT is made polygonal by cutting off the corners of a quadrangle, gates G can be arranged at predetermined intervals without shortening the gate width. An appropriate cut-off quantity (L1 shown in FIG. 2) of each corner of the polygon may be, for example, in the range of 0.05 to 0.6 μm (it goes without saying that no limitation is made to this range, depending on conditions). A range suitable for mass production may be from 0.1 to 0.5 μm, more preferably a range centered at 0.3 μm.

By making the planar shape of the active region ACT polygonal by cutting off the corners of a quadrangle, the distance between corners of adjacent active regions becomes wider and the stress imposed on the corners is reduced, even if the isolation widths (Ls1, Ls2) are set smaller than 0.3 μm. Therefore, such a crystal defect as is caused by the formation of STI and extends through between the source and drain is suppressed and it is possible to diminish the leakage current of MIS.

Although in this first embodiment there is illustrated an octagonal shape obtained by cutting off the four corners of a rectangle as the planar shape of the active region ACT in the mask ROM section, it goes without saying that no limitation is made thereto. For example, the planar shape of the active region ACT may be a hexagonal shape obtained by cutting off two corners of a rectangle or a dodecagonal shape obtained by cutting off the four corners of a rectangle in two different directions.

The sense amplifier data latch section, like the mask ROM section, includes plural active regions ACT formed on the main surface of the semiconductor substrate and an element isolation region which surrounds each active region ACT and which electrically isolates adjacent active regions ACT. In each active region ACT is formed, for example, a MIS having a gate G and a source and drain. For example, the active region ACT is formed so as to have a dimension of about 1.5 μm in a direction parallel to the gate length of MIS and a dimension of about 5 μm in a direction perpendicular to the gate length. The pitch of the gate G in MIS is determined to match the memory cell pitch. Further, the above dimensions of each active region ACT are determined taking into account the channel length and channel width of MIS for obtaining desired operation characteristics, as well as alignment between gate G and active region ACT and alignment between gate G and contact holes C1. The element isolation region is formed by STI for example. An isolation width (Ls1) in a direction parallel to the MIS gate length is, for example, about 0.3 μm and an isolation width (Ls2) in a direction perpendicular to the gate length is, for example, about 0.5 μm.

If the MIS gate length is 0.5 μm and the foregoing dimensions are used, the distance (La) between the active region ACT—element isolation region boundary and a side face of gate G is, for example, about 0.5 μm. In the sense amplifier data latch section, therefore, if the active region ACT is made polygonal by cutting off the corners of a quadrangle like that of each active region ACT formed in the foregoing mask ROM section, then for ensuring an alignment margin between the gate G and the active region ACT, it is necessary that the dimension of the active region ACT in a direction parallel to the gate length of MIS be made larger than 1.5 μm, resulting in that it becomes difficult to dispose MIS in conformity with the memory cell pitch. In the sense amplifier data latch section, therefore, the planar shape of each active region ACT is made quadrangular without cutting of the corners, whereby it becomes possible to dispose MIS in conformity with the memory cell pitch.

In the sense amplifier data latch section, the isolation width (Ls1) in a direction parallel to the gate length of MIS is as narrow as, for example, about 0.3 μm and a crystal defect caused by STI which constitutes this element isolation region may appear in a direction perpendicular to the gate length. However, this crystal defect is difficult to become a cause of defect of MIS because it does not cross between the source and the drain. A crystal defect which occurs in a direction parallel to the MIS gate length is suppressed by setting the isolation width (Ls2) in a direction perpendicular to the MIS gate length to about 0.5 μm.

The decoder section, like the mask ROM section and the sense amplifier-data latch section, includes plural active regions ACT formed on the main surface of the semiconductor substrate and an element isolation region which surrounds each active region ACT and which electrically isolates adjacent active regions ACT. In each active region ACT is formed, for example, a MIS having a gate G and a source and drain. For example, the active region ACT is formed so as to have a dimension of about 6 μm in a direction parallel to the gate length of MIS and a dimension of about 2.5 μm in a direction perpendicular to the gate length. The element isolation region is constituted by STI for example and its isolation widths (Ls1, Ls2) in directions parallel and perpendicular to the MIS gate length are each about 1 μm. Thus, the element isolation region can be formed to have a wider isolation width than in the mask ROM section or the sense amplifier data latch section.

Even if the MIS gate length is set at 0.8 µm and the foregoing dimensions are used, there occurs an alignment margin between the gate G and the active region ACT. Therefore, like the active regions ACT formed in the mask ROM section, the planar shape of each active region ACT can be made polygonal by cutting off the corners of quadrangle. As a result, it is possible to suppress the occurrence of crystal defects caused by the formation of STI. Moreover, in the decoder section, the isolation width of the element isolation region is as wide as about 1 µm, the stress imposed on each active region ACT is small and a crystal defect is difficult to occur in the active region ACT. For this reason, the planar shape of the active region ACT may be made quadrangular without cutting off the corners. In FIG. 2(c) there are illustrated active regions ACT each having a rectangular plane shape.

Thus, in this first embodiment, active regions ACT each having a polygonal plane shape obtained by cutting off the corners of a quadrangle and active regions ACT each having a quadrangular plane shape are provided within a single semiconductor chip. That is, although the planar shape of plural active regions ACT formed within the semiconductor chip in this first embodiment are polygonal, active regions ACT different in the number of corners are mixed together. In this first embodiment, by so forming the active regions, both highly reliable MIS and highly integrated MIS can be disposed within a single semiconductor chip. For example, in the mask ROM section which requires an element isolation region having an isolation width of smaller than 0.3 µm, the occurrence of a crystal defect in the active regions ACT is suppressed by cutting off the corners of a quadrangle and thereby making the planar shape of the active regions polygonal. As a result, it is possible to diminish the leakage current flowing between the source and drain of MIS for example, affording a highly reliable MIS. Moreover, for example in the sense amplifier data latch section, by making the planar shape of the active regions ACT quadrangular, it becomes unnecessary to take into account an increase of the alignment margin caused by cutting off the corners between the MIS gate G and the active regions ACT, thus permitting arrangement of MIS at a pitch matching the memory cells and affording a highly integrated MIS. Further, for example in the decoder section having an element isolation region with an isolation width of about 1 µm, a crystal defect is difficult to occur in the active regions ACT, so that either a polygonal shape obtained by cutting off the corners of a quadrangle or a quadrangular shape can be selected as the planar shape of the active regions ACT.

Next, an example of a method for manufacturing a flash memory according to this first embodiment will be described below step by step with reference to FIGS. 3 to 14.

For example, a thin isolation region and active regions ACT arranged in such a manner as are surrounded by the isolation region are formed on a main surface of a semiconductor substrate (at this stage a thin semiconductor sheet having a generally circular plane shape called a semiconductor wafer). In this example, as shown in FIG. 1, a planar shape of active regions ACT in the mask ROM section is a polygonal shape obtained by cutting off the corners of a quadrangle, while a planar shape of active regions ACT in both sense amplifier data latch section and decoder section is a quadrangular shape. The isolation region is formed for example in the following manner.

Figure 4:
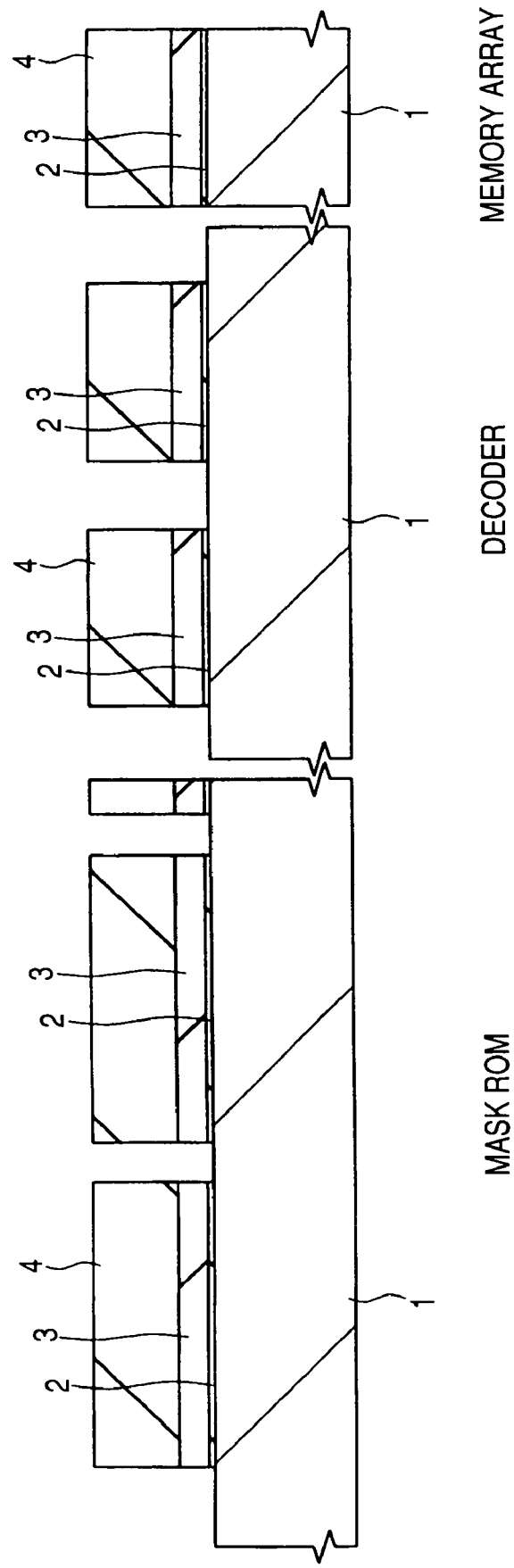
FIG. 4 is a sectional view of principal sections of the flash memory in the same manufacturing step as FIG. 3.

FIGS. 3 and 4 illustrate a manufacturing step for the flash memory of the first embodiment. More particularly, FIG. 3(a) is a plan view of a principal portion of the mask ROM section, FIG. 3(b) is a plan view of a principal portion of the sense amplifier data latch section, FIG. 3(c) is a plan view of the decoder section, and FIG. 4 is a sectional view of a principal portion including the mask ROM section, decoder section and memory array.

First, a semiconductor substrate 1 is heat-treated at about 850° C. to form on a main surface thereof a pad oxide film 2 having a thickness of about 10 nm. Then, a silicon nitride film 3 having a thickness of about 120 nm is deposited on the pad oxide film 2 by a CVD (Chemical Vapor Deposition) method. Thereafter, with a resist pattern 4 formed by a photolithography method as mask, the silicon nitride film 3 and pad oxide film 2 in the element isolation region exposed from the mask are removed by a dry etching method. The pad oxide film 2 is formed for the purpose of relaxing a stress imposed on the semiconductor substrate 1 for example when densifying a silicon oxide film which is embedded in the interior of an isolation trench in a later step. The silicon nitride film 3 has a property difficult to be oxidized and is therefore utilized as a mask for preventing oxidation of a surface of the semiconductor substrate 1 as an underlying portion (active region).

In this first embodiment, a polygon is formed beforehand by cutting off the corners of a quadrangle on a resist pattern formed by photolithography and an isolation trench which reflects the resist pattern shape is formed in the semiconductor substrate 1 by dry etching. However, how to form the isolation trench is not limited to this method. For example, the resist pattern may be formed in a quadrangular shape and an isolation trench may be formed in the semiconductor substrate 1 so as to permit formation of active regions ACT of a polygonal shape obtained by cutting off the corners of a quadrangle by dry etching which utilizes only the photoresist processing or dry etching which utilizes a thin-dense difference of patterns.

At the time of forming the resist pattern in a polygonal shape, there sometimes occurs a case where the corners of the polygonal shape are rounded by processing sag of the photoresist for example. That is, there sometimes occurs a case where the resist pattern shape, to be exact, is not a polygonal shape having corner portions, but a circular shape having plural inflection points. In this first embodiment, however, it is assumed that even such a circular shape having plural inflection points is included in the polygonal shape.

The corner portions of the resist pattern may be rounded positively. More particularly, in the case of the aforesaid quadrangular shape, the corner portions of the resist pattern are formed as curved lines having a predetermined radius of curvature. In this way, also when forming each active region ACT in a circular shape, the occurrence of such a crystal defect as crosses between the source and drain caused by the formation of STI is suppressed and it is possible to diminish the leakage current in MIS.

Subsequently, the resist pattern 4 is removed and with the silicon nitride film 3 as mask, the semiconductor substrate 1 exposed from the mask is removed by dry etching to form an isolation trench about 300 nm deep in the semiconductor substrate 1 in the element isolation region. Thereafter, for removing a damaged layer resulting from the etching in the inner wall of the isolation trench, the semiconductor substrate 1 is heat-treated in an oxygen-containing atmosphere held at a temperature of about 1100° C. By this heat treatment a thin silicon oxide film (not shown) is formed on the inner wall of the isolation trench. At this time, a silicon oxy-nitride film can also be formed on the inner wall of the isolation trench by further heat-treating the semiconductor substrate in an atmosphere containing both oxygen and nitrogen. In this case, it is possible to further relax the stress which is imposed on the semiconductor substrate 1 for example at the time of densifying a silicon oxide film embedded in the interior of the isolation trench in a later step. Further, the silicon nitride film may be formed by CVD instead of the above heat treatment performed in an atmosphere containing both oxygen and nitrogen. Also in this case it is possible to obtain the same effect as above.

Figure 5:
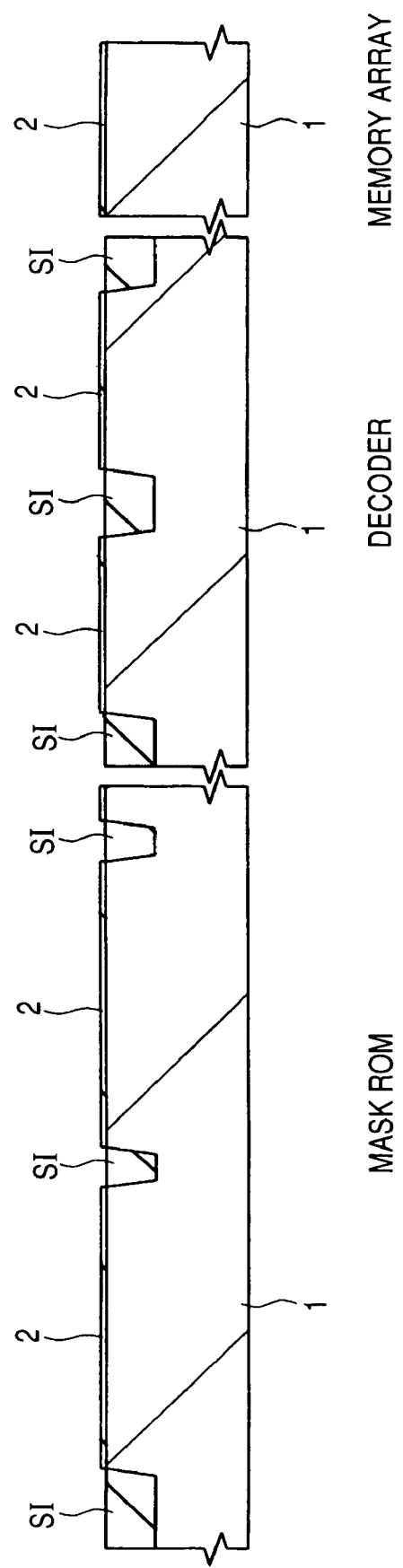
FIG. 5 is a sectional view of the same principal sections as FIG. 4 in a flash memory manufacturing step which follows FIGS. 3 and 4.

Next, FIG. 5 is a sectional view of the same portion as FIG. 4 in a manufacturing step which follows.

An insulating film, e.g., silicon oxide film, is deposited on the main surface of the semiconductor substrate 1 by CVD and, for improving the quality of the insulating film, the semiconductor substrate 1 is heat-treated at a temperature of about 1150° C. to densify the insulating film. Thereafter, the insulating film is polished by a CMP (chemical mechanical polishing) method using the silicon nitride film 3 as a stopper, allowing the insulating film to remain in the interior of the isolation trench, thereby forming an isolation section SI having a flattened surface. Thereafter, the silicon nitride film 3 is removed. The insulating film to be left in the interior of the isolation trench is not limited to the silicon oxide film formed by CVD, but may be a silicon oxide film formed by a coating method for example. In case of adopting the coating method, the silicon oxide film embedding performance into the isolation trench can be improved in comparison with the CVD method. Even in case of forming the lower portion of the isolation trench with the silicon oxide film obtained by the coating method and forming the upper portion of the isolation trench with the silicon oxide film obtained by the CVD method, that is, even in case of using a laminate film of both the silicon oxide film formed by the coating method and the silicon oxide film formed by the CVD method, it is possible to obtain the same effect as above.

Figure 6:
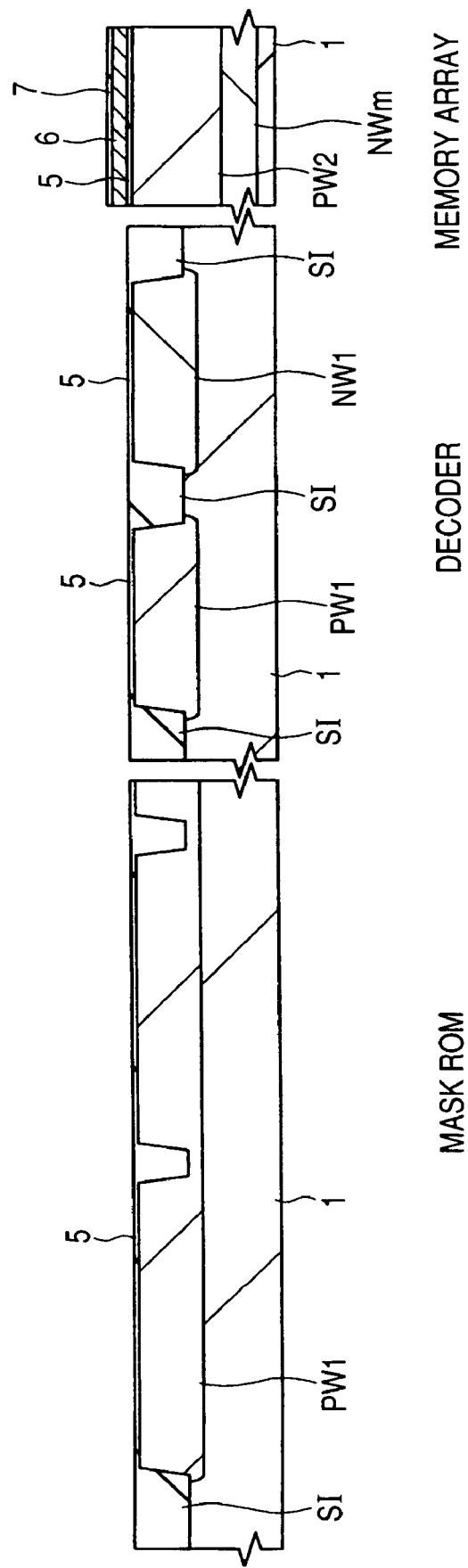
FIG. 6 is a sectional view of the same principal sections as FIG. 4 in a flash memory manufacturing step which follows FIG. 5.

FIG. 6 is a sectional view of the same principal portion as FIG. 4 in a manufacturing step which follows.

Buried n-well NWm, p-well PW1, PW2 and n-well NW1 are formed by introducing predetermined impurities into predetermined portions of the semiconductor substrate 1 by an ion implantation method.

Next, the main surface of the semiconductor substrate 1 is washed to constitute a gate insulating film (tunnel insulating film) of memory cells on the substrate main surface. For example, an insulating film 5 having a thickness of, for example, about 10 nm is formed by a thermal oxidation method and thereafter a conductor film of polycrystalline silicon low in resistance and having a thickness of, for example, about 100 nm is deposited on the main surface of the semiconductor substrate 1. In forming the insulating film 5, an end portion of the isolation trench in the isolation section SI is also oxidized, so that a stress is imposed on the interface between the silicon (silicon which constitutes the semiconductor substrate) present at the corners and the silicon oxide film (the silicon oxide film buried in the interior of the isolation trench). However, in the mask ROM section having active regions ACT surrounded by the element isolation region having an isolation width of smaller than 0.3 μm, its planar shape is a polygonal shape formed by cutting off the corners of a quadrangle, so that the stress induced in the active regions ACT can be suppressed by the isolation section SI. In the sense amplifier data latch section and the decoder section both having active regions ACT surrounded by the element isolation region having an isolation with of 0.3 μm or more, the stress induced in the active regions ACT by the isolation section SI is relatively small because the isolation width is relatively large.

Subsequently, with a resist pattern formed by photolithography as mask, the conductor film exposed from the mask is removed by dry etching, whereby floating gate electrodes 6 of memory cells are patterned in the gate width direction.

Next, for example silicon oxide film, silicon nitride film and silicon oxide film are deposited successively in an ascending order onto the main surface of the semiconductor substrate 1 by CVD to form an interlayer film 7 having a thickness of, for example, about 18 nm. Then, with a resist pattern formed by photolithography as mask, the interlayer film 7 and conductor film in each of the mask ROM section, sense amplifier data latch section decoder section are removed by dry etching.

As a problem to be noted is a problem such that, in the semiconductor device including the flash memory, the step of depositing the silicon oxide film and the silicon nitride film, as in the formation of the interlayer film 7, increases, with a consequent increase in the number of times of heat treatment and the inclusion of oxygen gas during the formation of the interlayer film 7. Consequently, the volume of the insulating film buried in the interior of the isolation trench in STI is apt to change, thus leading to the problem that the stress imposed on the active regions ACT becomes easier to increase. That is, in manufacturing the semiconductor device including the flash memory, there arises the problem that stress and crystal defect are apt to occur.

Next, FIG. 7 is a sectional view of the same principal portion as FIG. 4 in a manufacturing step which follows.

By a thermal oxidation method for example, a gate insulating film 8 having a thickness of, for example, about 10 nm is formed on the main surface of the semiconductor substrate 1 in the mask ROM section, sense amplifier data latch section and decoder section. In forming the gate insulating film 8, as in the formation of the insulating film 5 described above, an end portion of the isolation trench in the isolation section SI is also oxidized, so that a stress is imposed on the interface between silicon and silicon oxide film particularly in the corner portions. In the mask ROM section, however, since its planar shape is a polygonal shape obtained by cutting off the corners of a quadrangle, the stress induced in each active region ACT region by the isolation section SI can be suppressed. Subsequently, a conductor film 9 formed by polycrystalline silicon of a low resistance and having a thickness of, for example, 70 nm, as well as a cap insulating film 10 formed by silicon oxide for example are deposited in this order from below on the main surface of the semiconductor substrate 1 by CVD.

Figure 8A:
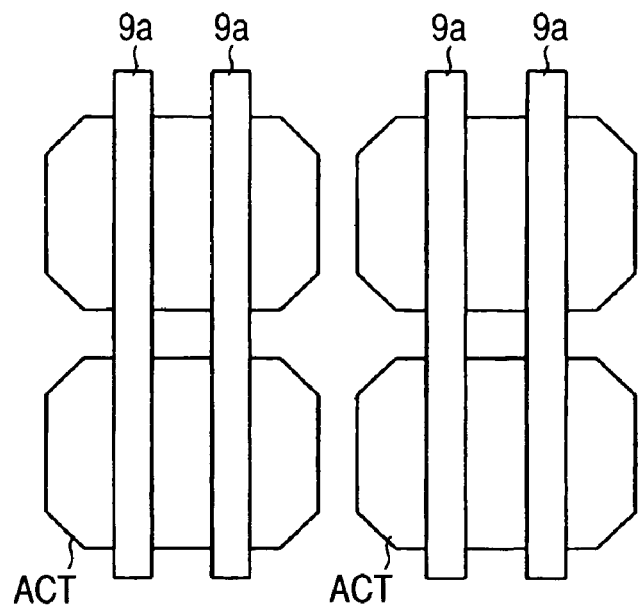
FIG. 8 is a plan view of the same principal sections as FIG. 3 in a flash memory manufacturing step which follows FIG. 7.
Figure 8B:
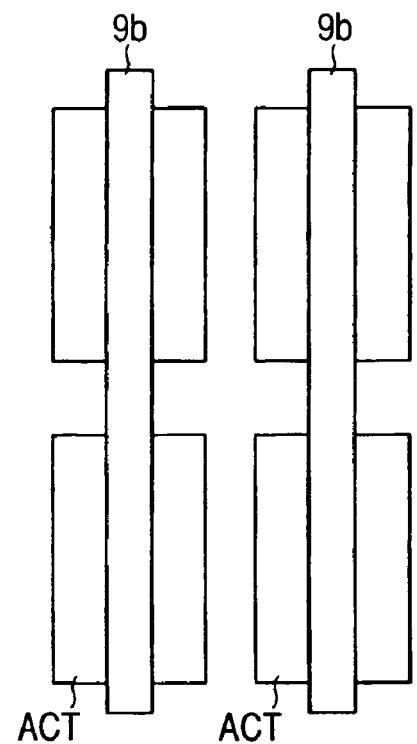
Figure 8C:
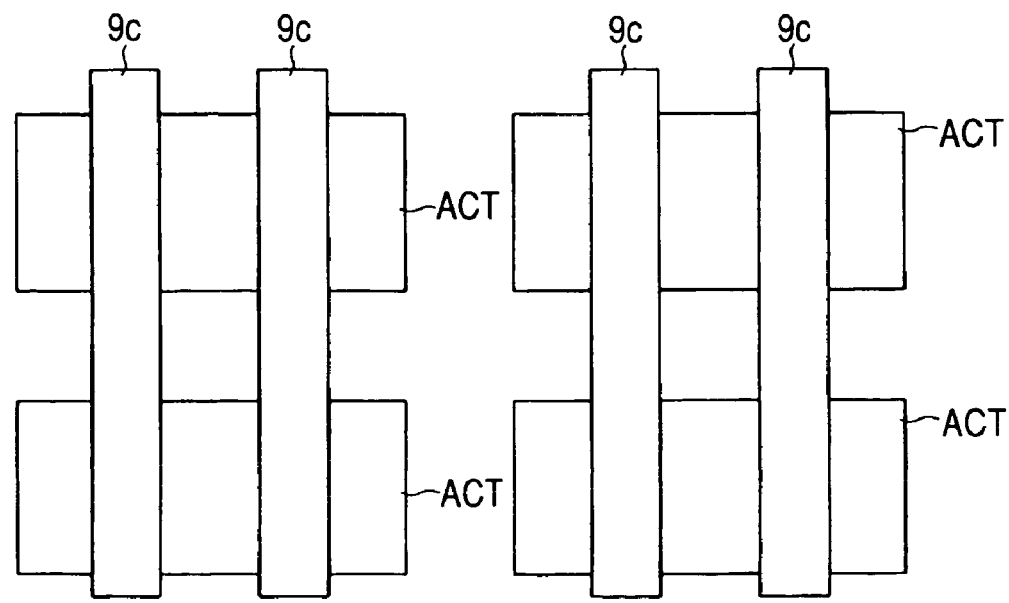
Figure 9:
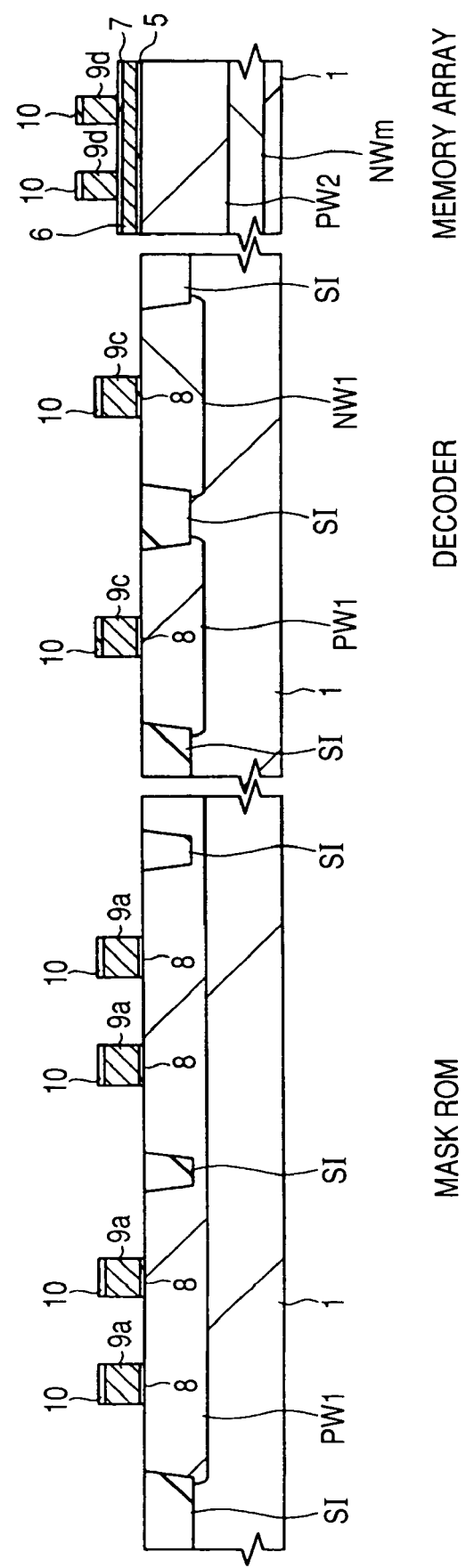
FIG. 9 is a sectional view of the same principal sections as FIG. 4 in a flash memory manufacturing step which follows FIG. 7.

Next, FIG. 8(a) is a plan view of the same portion as FIG. 3(a), FIG. 8(b) is a plan view of the same principal portion as FIG. 3(b), FIG. 8(c) is a plan view of the same principal portion as FIG. 3(c) and FIG. 9 is a sectional view of the same principal portion as FIG. 2, in a manufacturing step which follows.

With a resist pattern formed by photolithography as mask, the cap insulating film 10 and conductor film 9 exposed from the mask are removed by dry etching, whereby gate electrodes (local word lines) 9a of nMIS are formed in the mask ROM section, gate electrodes 9b of nMIS and pMIS are formed in the sense amplifier data latch section, gate electrodes 9c of nMIS and pMIS are formed in the decoder section, and control gate electrodes (word lines) 9d of memory cells are formed in the memory array. For forming the gate electrodes 9a, 9b, 9c and 9d, the cap insulating film 10 and the conductor film 9 may be patterned continuously with the resist pattern as mask, or the cap insulating film 10 may be patterned with the resist pattern as mask and thereafter the conductor film 9 may be patterned with the cap insulating film 10 as mask.

Next, FIG. 10 is a sectional view of the same portion as FIG. 3 in a manufacturing step which follows.

A resist pattern is formed by photolithography, then with the resist pattern and the cap insulating film 10 as mask, the interlayer film 7 and conductor film exposed from the mask are removed by dry etching, whereby the floating gate electrodes 6 of memory cells are patterned in the gate length direction. As a result, the control gate electrodes 9d and floating gate electrodes 6 of memory cells are completed. Subsequently, with the resist pattern as mask, an impurity, e.g., arsenic (As) or phosphorus (P), for the memory cell source and drain is introduced into the semiconductor substrate 1 by an ion implantation method to form a pair of n-type semiconductor regions 11 which constitute a part of the source and drain.

Subsequently, a pair of n-type semiconductor regions 12 of a relatively low impurity concentration are formed which constitute a part of the source and drain in each of nMIS in the mask ROM section, nMIS in the sense amplifier data latch section and nMIS in the decoder section. Further, by introducing, for example, boron (B) or boron fluoride ($BF_2$) by ion implantation, there are formed a pair of p-type semiconductor regions 12p of a relative low impurity concentration which constitute a part of the source and drain in each of pMIS in the sense amplifier data latch section and pMIS in the decoder section.

Next, an insulating film of silicon oxide for example is deposited by CVD on the main surface of the semiconductor substrate 1, followed by etch back by an anisotropic dry etching method to form side walls 13 on side faces of the memory cell gate electrodes (the floating gate electrodes 6 and the control gate electrodes 9d) in the memory array, the gate electrodes 9a of nMIS in the mask ROM section, the gate electrodes 9b of nMIS and pMIS in the sense amplifier data latch section and the gate electrodes 9c of nMIS and pMIS in the decoder section.

Then, a pair of n-type semiconductor regions 14 of a relatively high impurity concentration are formed which constitute another portion of the source and drain of each of memory cells in the memory array, n-MIS in the mask ROM section, nMIS in the sense amplifier data latch section and nMIS in the decoder section. Further formed are a pair of p-type semiconductor regions 15 of a relatively high impurity concentration which constitute another portion of the source and drain of each of nMIS in the sense amplifier data latch section and pMIS in the decoder section.

Thereafter, for activating the ion-implanted impurity, the semiconductor substrate 1 is subjected to a heat treatment at a temperature of, for example, 900-1000° C. In this heat treatment an end portion of the isolation trench in the isolation section SI is also oxidized as in the formation of the insulating film 5 described above, so that a stress is imposed on the interface between silicon and silicon oxide film particularly at the corner portions. However, since the planar shape of the mask ROM section is a polygonal shape obtained by cutting off the corners of a quadrangle, it is possible to suppress the stress which is induced in each active region ACT by the isolation section SI. Through the above steps there are formed memory cells and various MISs.

Figure 11A:
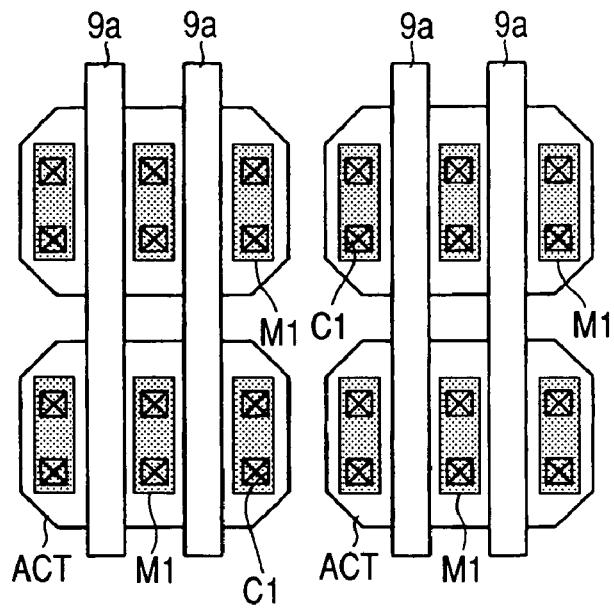
FIG. 11 is a plan view of the same principal sections as FIG. 3 in a flash memory manufacturing step which follows FIG. 10.
Figure 11B:
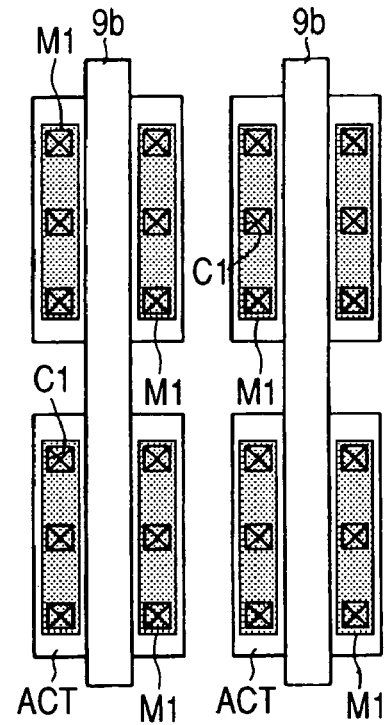
Figure 11C:
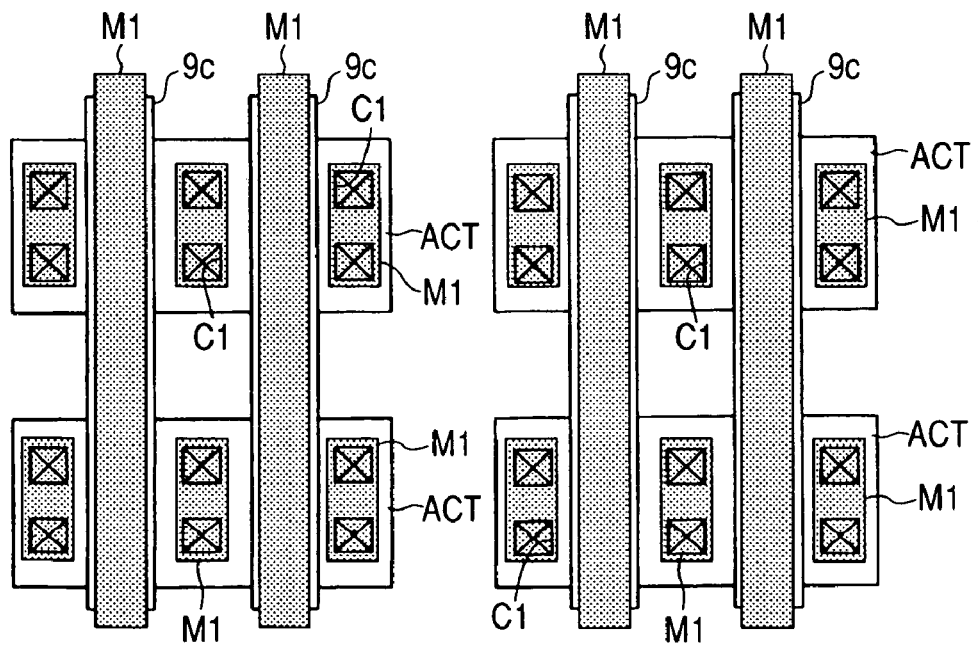
Figure 12:
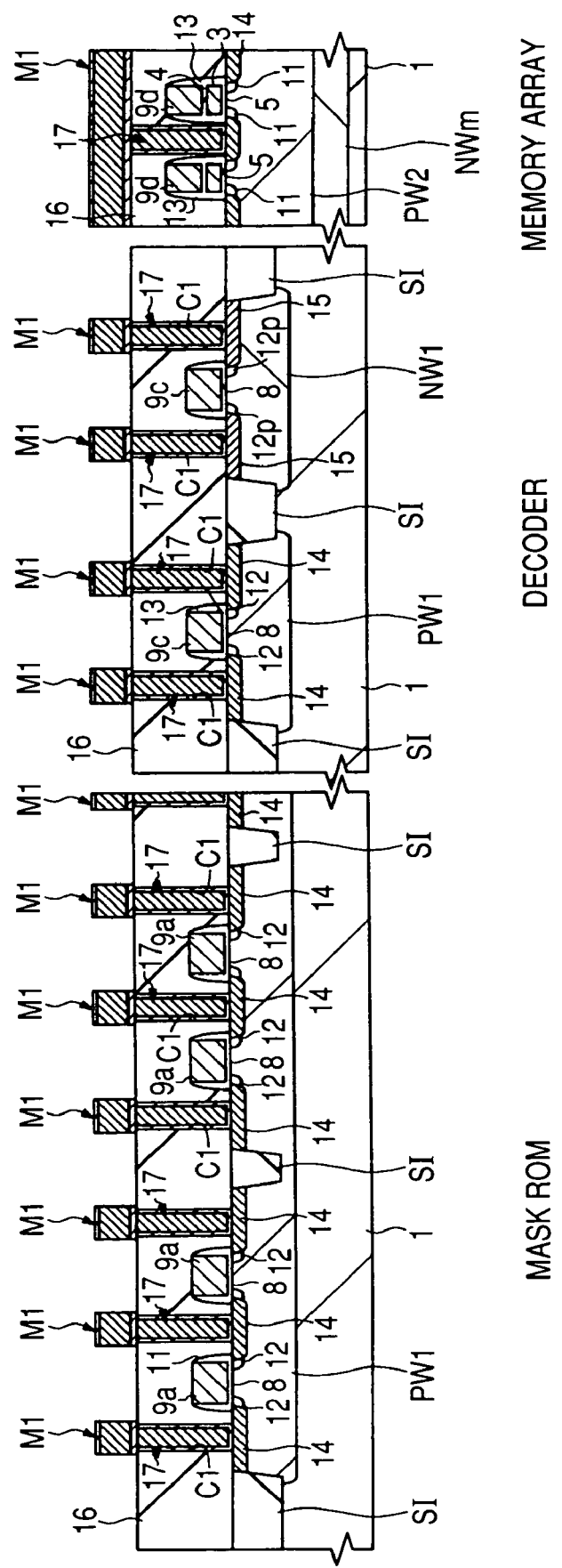
FIG. 12 is a sectional view of the same principal sections as FIG. 4 in a flash memory manufacturing step which follows FIG. 10.

Next, FIG. 11(a) is a plan view of the same principal portion as FIG. 3(a), FIG. 11(b) is a plan view of the same principal portion as FIG. 3 (b), FIG. 11c is a plan view of the same principal portion as FIG. 3(c) and FIG. 12 is a sectional view of the same principal portion as FIG. 4, in a manufacturing step which follows.

An insulating film of silicon oxide for example is deposited by CVD on the main surface of the semiconductor substrate 1, then with a resist pattern formed by photolithography as mask, the insulating film 16 exposed from the mask is removed by dry etching, whereby there are formed contact holes C1 to which are exposed a portion (e.g., memory cells and the sources and drains of various MISs) and a portion of word lines.

Subsequently, for example titanium (Ti) film, titanium nitride (TiN) film and tungsten (W) film are deposited successively in an ascending order onto the main surface of the semiconductor substrate 1 by sputtering or CVD. Thereafter, these metallic films are polished by CMP so as to remain in only the interiors of the contact holes C1, thereby forming plugs 17 in the interiors of the contact holes C1. Then, for example aluminum (Al) alloy film and titanium nitride film are deposited successively in an ascending order onto the main surface of the semiconductor substrate 1 by sputtering, thereafter, with a resist pattern formed by photolithography as mask, the titanium nitride film and the aluminum alloy film exposed from the mask are removed by dry etching to form a first-layer wiring (indicated by reticular hatching in FIG. 11) M1.

Figure 13:
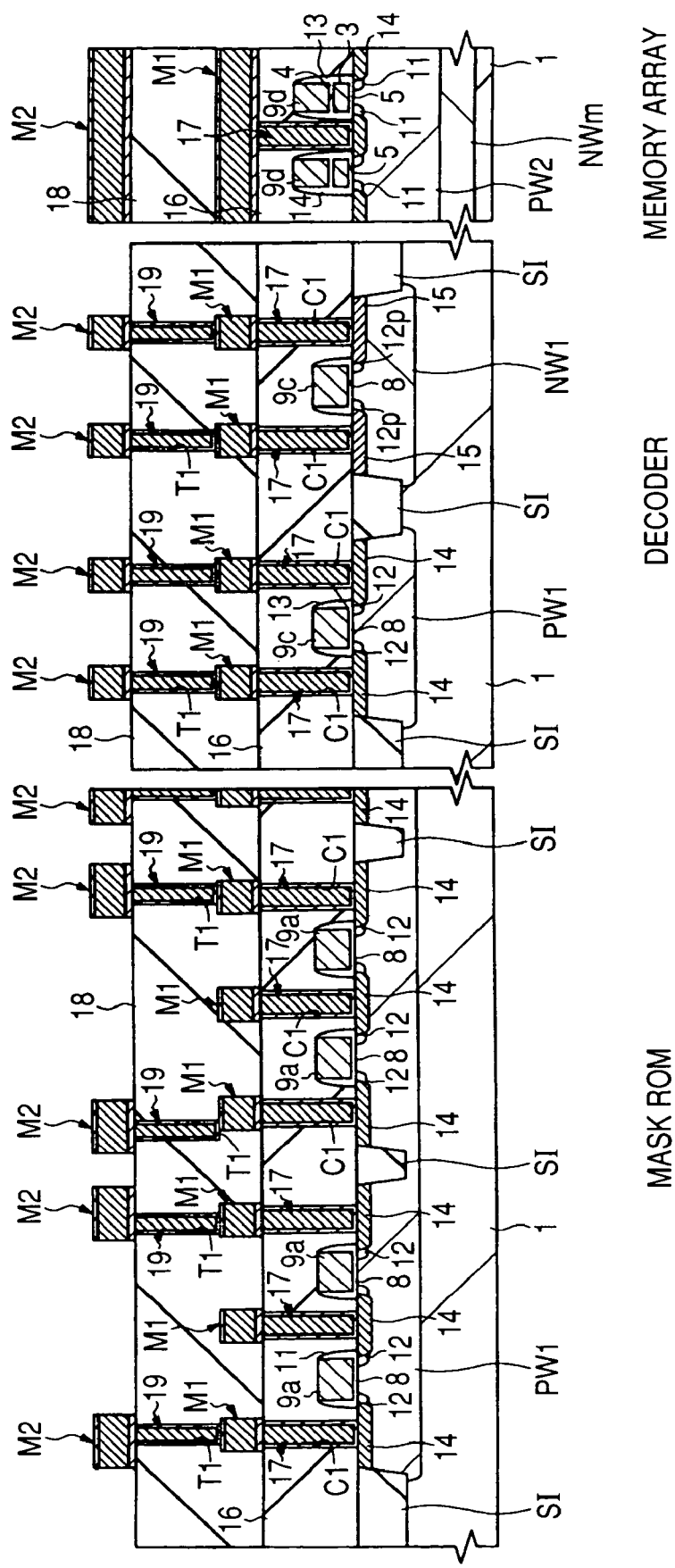
FIG. 13 is a sectional view of the same principal sections as FIG. 4 in a flash memory manufacturing step which follows FIGS. 11 and 12.

Next, FIG. 13 is a sectional view of the same principal portion as FIG. 4 in a manufacturing step which follows.

An insulating film 18 of silicon oxide for example is deposited on the main surface of the semiconductor substrate 1 by CVD, then with a resist pattern formed by photolithography as mask, the insulating film 18 exposed from the mask is removed by dry etching, whereby through holes T1 to which a part of the first-layer wiring M1 is exposed are formed in the insulating film 18.

Then, for example titanium film, titanium nitride film and tungsten film are deposited successively in an ascending order onto the main surface of the semiconductor substrate 1 by sputtering or CVD and thereafter these metallic films are polished by CMP so as to remain in only the interiors of the through holes T1, thereby forming plugs within the through holes T1. Then, for example aluminum alloy film and titanium nitride film are deposited successively in an ascending order onto the main surface of the semiconductor substrate 1 by sputtering and thereafter, with a resist pattern formed by photolithography as mask, the titanium nitride film and aluminum alloy film exposed from the mask are removed by dry etching to form a second-layer wiring M2. The second-layer wiring M2 is electrically connected to the first-layer wiring M1 through the plugs 19.

Figure 14:
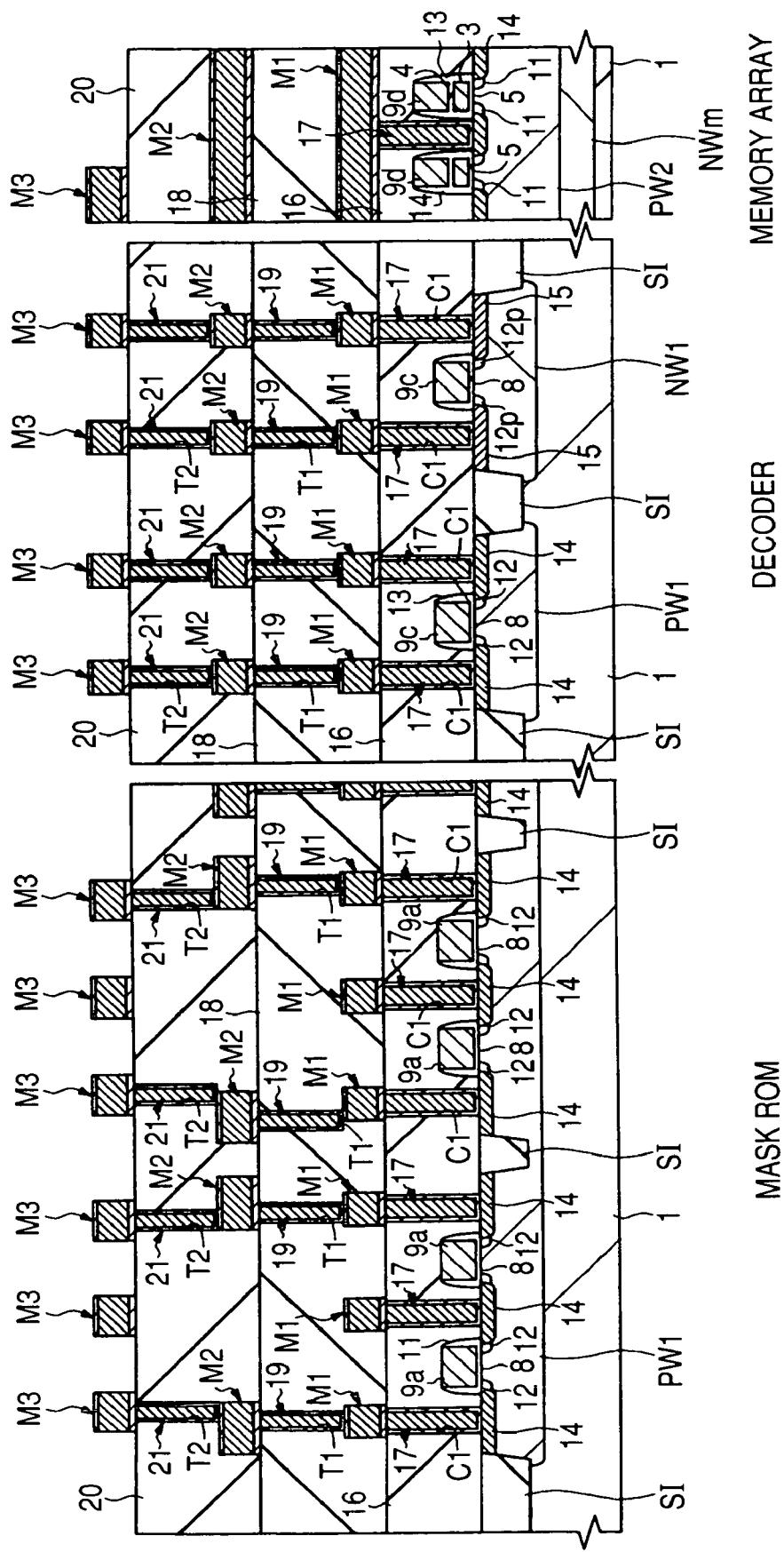
FIG. 14 is a sectional view of the same principal sections as FIG. 4 in a flash memory manufacturing step which follows FIGS. 11 and 12.

Next, FIG. 14 is a sectional view of the same principal portion as FIG. 4 in a manufacturing step which follows.

An insulating film 20 of silicon oxide for example is deposited onto the main surface of the semiconductor substrate 1 by CVD and thereafter through holes T2 to which a part of the second-layer wiring M2 is exposed are formed in the insulating film 20 by the same method as that for forming the through holes T2. Subsequently, by the same methods as the methods for forming the plugs 19 and the second-layer wiring M2, plugs 21 are formed within the through holes T2 and a third-layer wiring M3 is formed which is electrically connected to the second-layer wiring M2 through the plugs 21.

Thereafter, an overlying wiring is formed and the surface of the top wiring layer is covered with a surface protecting film. Then, apertures to which a part of the top wiring layer is exposed are formed in the surface protecting film to form bonding pads, thereby affording a flash memory.

The isolation width of the element isolation region and the thicknesses of various films referred to above in this first embodiment are only examples and it goes without saying

Second Embodiment

Figure 15A:
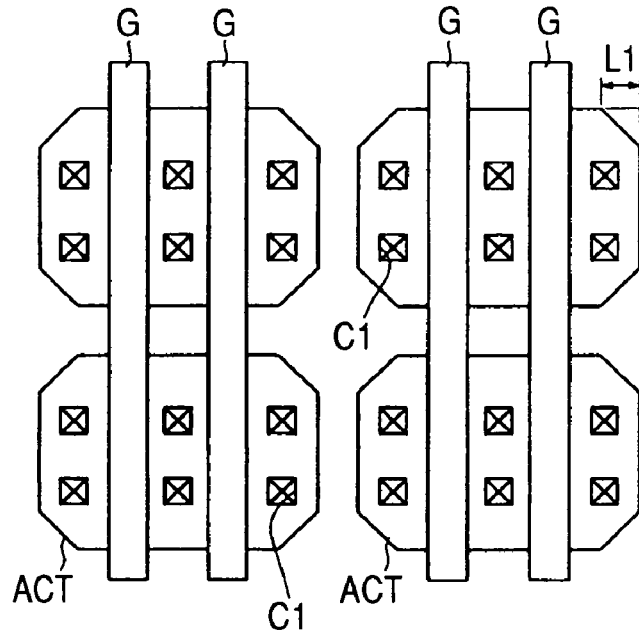
Figure 15B:
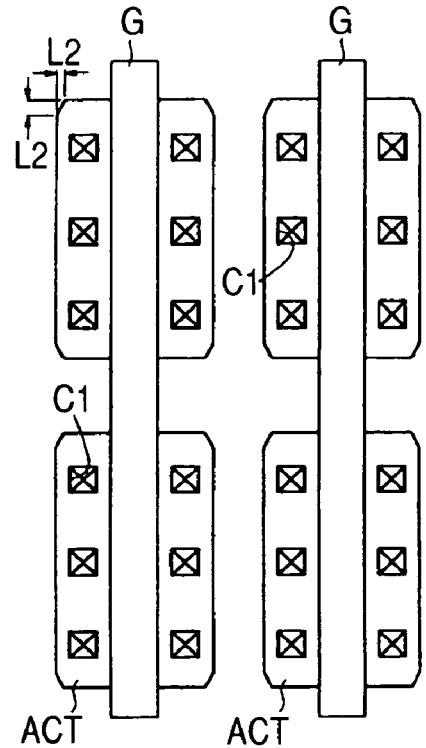
Figure 15C:
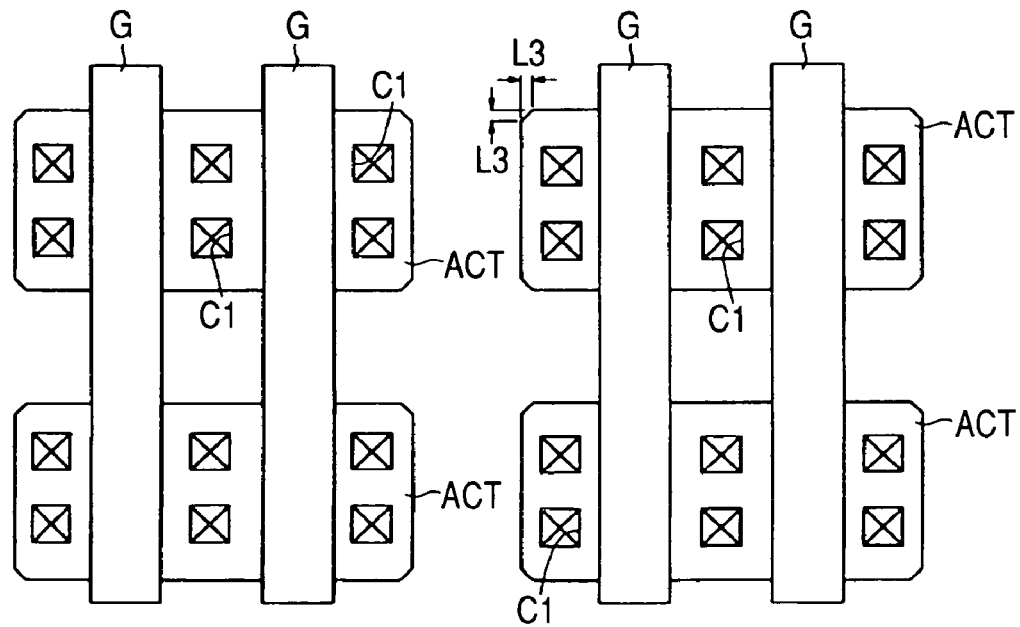

FIGS. 15(a), 15(b) and 15(c) are plane layout diagrams of a typical MIS formed within a semiconductor chip according to a second embodiment of the present invention, in which FIG. 15(a) shows a mask ROM section, FIG. 15(b) shows a sense amplifier data latch section, and FIG. 15(c) shows a decoder section.

In the mask ROM section, as in the first embodiment, the isolation width of an element isolation region is smaller than 0.3 µm, but by making a planar shape of active regions polygonal by cutting off the corners of a rectangle, the occurrence of such a crystal defect as extends through between the source and drain which is attributable to the formation of STI is suppressed and it is possible to diminish the leakage current in MIS.

Further, according to this second embodiment, also in active regions ACT in the sense amplifier data latch section, a planar shape of the active regions ACT is made polygonal by cutting off the corners of a quadrangle. However, the cut-off quantity (L2) of each active region ACT is made smaller than that (L1) which is set for each active region ACT in the mask ROM section, thereby allowing a margin to remain in the alignment between gates G and active regions ACT. In the sense amplifier data latch section, the larger the cut-off quantity (L2), the smaller becomes the margin in the gate G—active region ACT alignment, and thus it becomes difficult to dispose MIS in conformity with the pitch of memory cells. Therefore, it is preferable that the cut-off quantity L2 be kept within, for example, 0.3 µm or less. As a result, in the sense amplifier data latch section, even if there is adopted an element isolation region having an isolation width of, for example, smaller than 0.3 µm, it is possible to suppress the occurrence of a crystal defect attributable to the formation of STI and it becomes possible to dispose MIS in conformity with the pitch of memory cells.

In the decoder section, as described in the first embodiment, a planar shape of active regions ACT can be made polygonal by cutting off the corners of a quadrangle or can be made quadrangular. In FIG. 15(c) are illustrated active regions ACT having a polygonal plane shape obtained by cutting off the corners of a quadrangle. In this case, there is a margin in the gate G—active region ACT alignment and therefore the cut-off quantity L3 can be made within, for example, about 0.6 µm.

Thus, in this second embodiment, active regions ACT mutually different in the amount to be cut off are provided within a single semiconductor chip. That is, in this second embodiment, a plurality of active regions ACT having a polygonal plane shape obtained by cutting off the corners of a quadrangle are present, but the active regions ACT are formed so that in the mask ROM section there are present active regions ACT large in the cut-off quantity of the corners of a quadrangle, while in the sense amplifier data latch section and the decoder section there are present active regions ACT small in the cut-off quantity of corners of a quadrangle. Thus, active regions ACT different in the corner cut-off quantity are present in a mixed state. By forming such active regions it is possible to dispose both highly reliable MIS and highly integrated MIS within a single semiconductor chip. In the mask ROM section having an element isolation region with an isolation width of, for example, smaller than 0.3 µm, the occurrence of a crystal defect in the active regions ACT is suppressed by making the planar shape of the active regions ACT polygonal as a corner-cut-off shape of a quadrangle. Also in the sense amplifier data latch section, by making the planar shape of the active regions ACT polygonal as an corner-cut-off shape of a quadrangle, it is possible to suppress the occurrence of a crystal defect in the active regions ACT even if there is adopted a element isolation region having an isolation width of, for example, smaller than 0.3 µm. Moreover, by making the corner-cut-off quantity small relatively, it becomes possible to dispose MIS at a narrow pitch matching the pitch of memory cells.

The corners of each active regions ACT may be rounded positively. That is, when consideration is made on the basis of the above quadrangular shape, each active region ACT is formed so that each corner thereof is a curved line having a predetermined radius of curvature. More specifically, active regions ACT are formed in such a manner that, with respect to the plural active regions ACT formed within a semiconductor chip in this second embodiment, the mask ROM section has active regions ACT of a relatively large radius of curvature, while the sense amplifier data latch section and the decoder section have active regions ACT of a relatively small radius of curvature, and thus active regions ACT different in radius of curvature are present in a mixed state. In this way, even when the active regions ACT are formed in a circular shape, the occurrence of such a crystal defect as extends through between the source and drain which is attributable to the formation of STI is suppressed and it is possible to diminish the leakage current in MIS.

Although the present invention has been described above concretely by way of embodiments thereof, it goes without saying that the present invention is not limited to the above embodiments, but that various changes may be made within the scope not departing from the gist of the invention.

For example, although in each of the above embodiments the present invention is applied to the semiconductor device with a flash memory mounted thereon as a background application field of the invention, no limitation is made thereto, but the present invention is applicable to any of semiconductor devices having STI, e.g., logic products at large, including DRAM (Dynamic Random Access Memory) and SRAM (Static Random Access Memory), as well as CCD (Charge Coupled Device).

The present invention is applicable to a semiconductor device wherein an element isolation region is constituted by STI for example and wherein both a highly reliable MIS and a highly integrated MIS are formed within a single semiconductor chip.

What is claimed is:

1. A method of manufacturing a semiconductor device, comprising the steps of:
    (a) forming an element isolation region over a semiconductor substrate to define a first region and a second region of the semiconductor substrate;
    (b) forming an insulating film over each of the first and second regions; and
    (c) forming a conductor film over the insulating film,
    wherein, in the step (a), the first region is formed so as to have a polygonal plane shape obtained by cutting off the corners of a quadrangle and the second region is formed so as to have a quadrangular plane shape, and
    (d) patterning the conductor film to form gate electrodes of first and second MISFETs in the first region and a gate electrode of a third MISFET in the second region.

2. A method according to claim 1, wherein the step (a) comprises the steps of:

(a1) forming a trench in the semiconductor substrate;
(a2) burying an insulating film within the trench; and
(a3) performing a heat treatment after the step (a2).

3. A method according to claim 1, wherein the first region is formed in a plural number at intervals of less than 0.3 µm.

4. A method according to claim 1, wherein a cut-off quantity of the corners of the quadrangle in the first region is in the range of 0.5 to 0.6 µm.

5. A method according to claim 1, wherein the length of the first region in the gate length direction of the first and second MISFETs is larger than the length of the second region in the gate length direction of the third MISFET.

6. A method according to claim 5,
wherein the first and second regions are each formed in a plural number, and
wherein the interval of the plural first regions in the gate width direction of the first and second MISFETs is narrower than that of the plural second regions in the gate width direction of the third MISFET.

7. A method of manufacturing a semiconductor device, comprising the steps of:
(a) forming an element isolation region over a semiconductor substrate to define a first region and a second region of the semiconductor substrate;
(b) forming an insulating film over each of the first and second regions; and
(c) forming a conductor film over the insulating film,
wherein, in the step (a), the first and second regions are formed so as to have a polygonal plane shape obtained by cutting off the corners of a quadrangle, a cut-off quantity of the corners of the quadrangle in the first region being larger than that of the corners of the quadrangle in the second region, and
(d) patterning the conductor film to form gate electrodes of first and second MISFETs in the first region and a gate electrode of a third MISFET in the second region.

8. A method according to claim 7, wherein the step (a) comprises:
(a1) forming a trench in the semiconductor substrate;
(a2) burying an insulating film within the trench; and
(a3) performing a heat treatment after the step (a2).

9. A method according to claim 7, wherein the first region is formed in a plural number at intervals of less than 0.3 µm.

10. A method according to claim 7, wherein a cut-off quantity of the corners of the quadrangle in the first region is in the range of 0.5 to 0.6 µm.

11. A method according to claim 7, wherein the length of the first region in the gate length direction of the first and second MISFETs is larger than that of the second region in the gate length direction of the third MISFET.

12. A method according to claim 11,
wherein the first and second regions are each formed in a plural number, and
wherein the interval of the plural first regions in the gate width direction of the first and second MISFETs is narrower than that of the plural second regions in the gate width direction of the third MISFET.

* * * * *